US012618897B2

(12) United States Patent
Yoshimura

(10) Patent No.: US 12,618,897 B2
(45) Date of Patent: May 5, 2026

(54) TEST APPARATUS FOR SEMICONDUCTOR DEVICE AND METHOD OF MANUFACTURING SEMICONDUCTOR DEVICE

(71) Applicant: Mitsubishi Electric Corporation, Tokyo (JP)

(72) Inventor: Takuya Yoshimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 149 days.

(21) Appl. No.: 18/413,486

(22) Filed: Jan. 16, 2024

(65) Prior Publication Data

US 2024/0345156 A1 Oct. 17, 2024

(30) Foreign Application Priority Data

Apr. 13, 2023 (JP) ................................. 2023-065517

(51) Int. Cl.
*G01R 31/28* (2006.01)
*H01L 21/66* (2006.01)

(52) U.S. Cl.
CPC ..... *G01R 31/2881* (2013.01); *G01R 31/2886* (2013.01); *H01L 22/14* (2013.01)

(58) Field of Classification Search
CPC ........................ G01R 31/2881; G01R 31/2886; G01R 1/067; G01R 1/04; G01R 1/06705; G01R 1/073; G01R 31/2601; H01L 22/14
See application file for complete search history.

(56) References Cited

U.S. PATENT DOCUMENTS 6,054,651 A * 4/2000 Fogel ........................ H01B 3/46
174/110 F
2010/0052714 A1* 3/2010 Miller ................ G01R 31/2875
324/754.07

(Continued)

FOREIGN PATENT DOCUMENTS

JP 3211220 U 6/2017
JP 2018-160591 A 10/2018
JP 2022-070475 A 5/2022

OTHER PUBLICATIONS

"Notice of Reasons for Refusal" Office Action issued in JP 2023-065517; mailed by the Japanese Patent Office on Jan. 27, 2026.

*Primary Examiner* — Akm Zakaria
(74) *Attorney, Agent, or Firm* — Studebaker Brackett PLLC

(57) ABSTRACT

Provided is a test apparatus for a semiconductor device which enhances the reliability of a test on electrical characteristics. The test apparatus includes a stage, a probe holder, probes, a wind protection wall, and a gas supply part. The stage is capable of holding a semiconductor wafer in which the semiconductor device is formed. The probe holder is disposed above the stage. The probes each include a tip contactable with the semiconductor device, and are held by the probe holder. The wind protection wall circumferentially surrounds the probes. The gas supply part is disposed outside the wind protection wall. The gas supply part supplies gas in a direction toward the stage. Each of the probes includes an inner part closer to a base end than to the tip. The inner parts are contained in a wind protection space surrounded by the wind protection wall.

17 Claims, 5 Drawing Sheets

(56) References Cited

U.S. PATENT DOCUMENTS

| 2015/0015285 A1* | 1/2015 | Shinohara | ........... G01R 31/2862 |
| | | | 324/750.19 |
| 2015/0054535 A1* | 2/2015 | Yoshioka | ........... G01R 31/2886 |
| | | | 324/750.14 |
| 2017/0299629 A1 | 10/2017 | Tsai et al. | |

* cited by examiner

F I G. 1
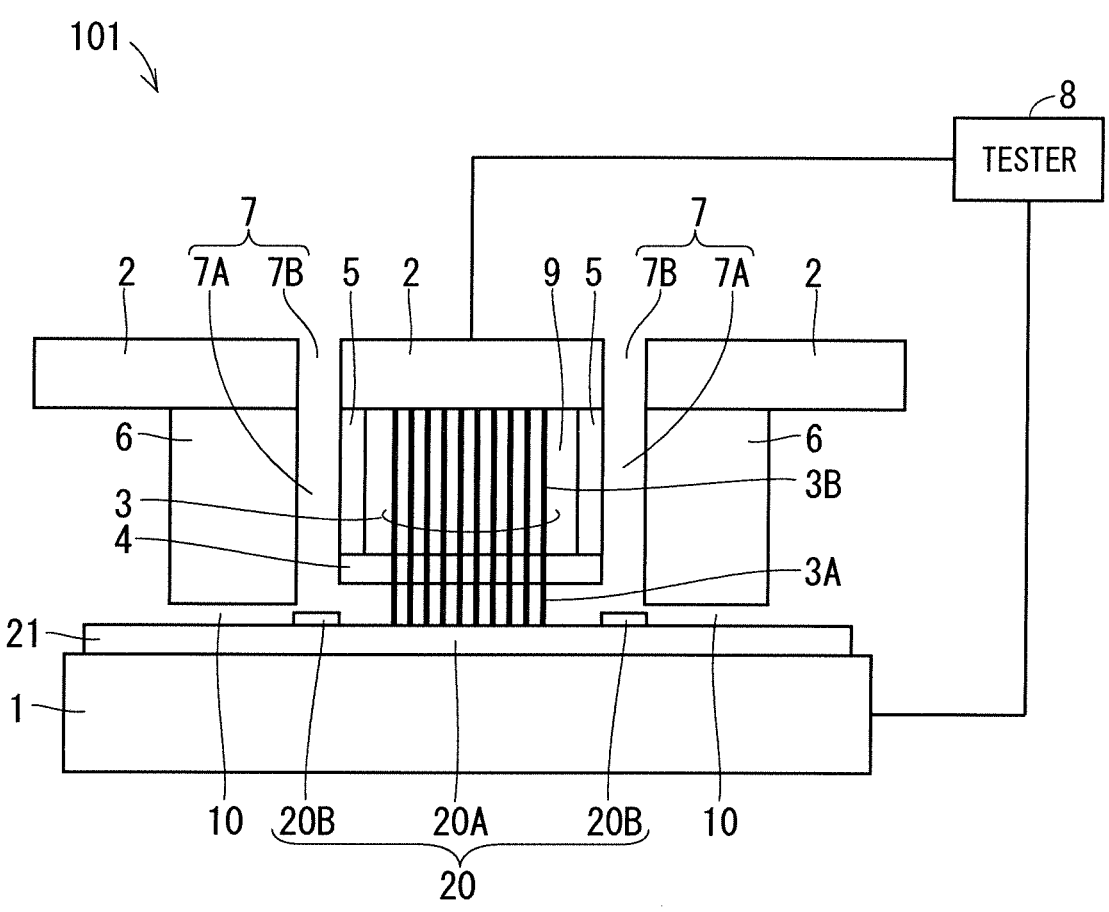

F I G. 2
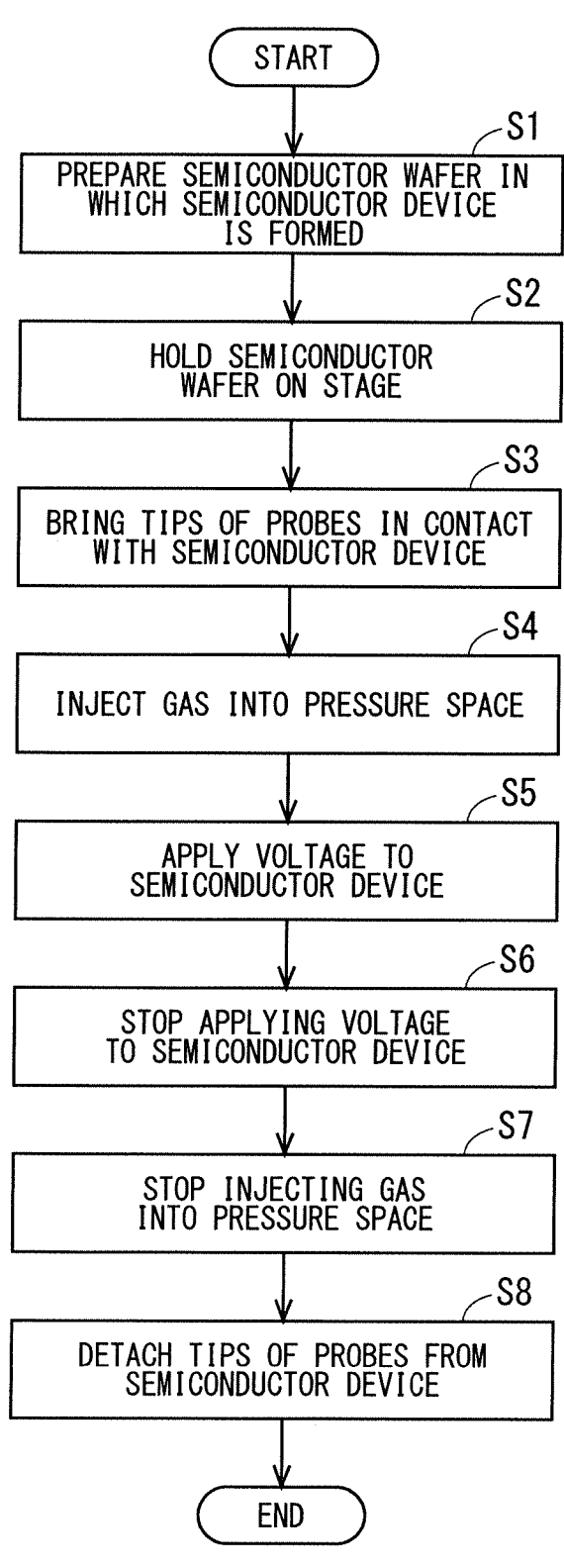

F I G. 3
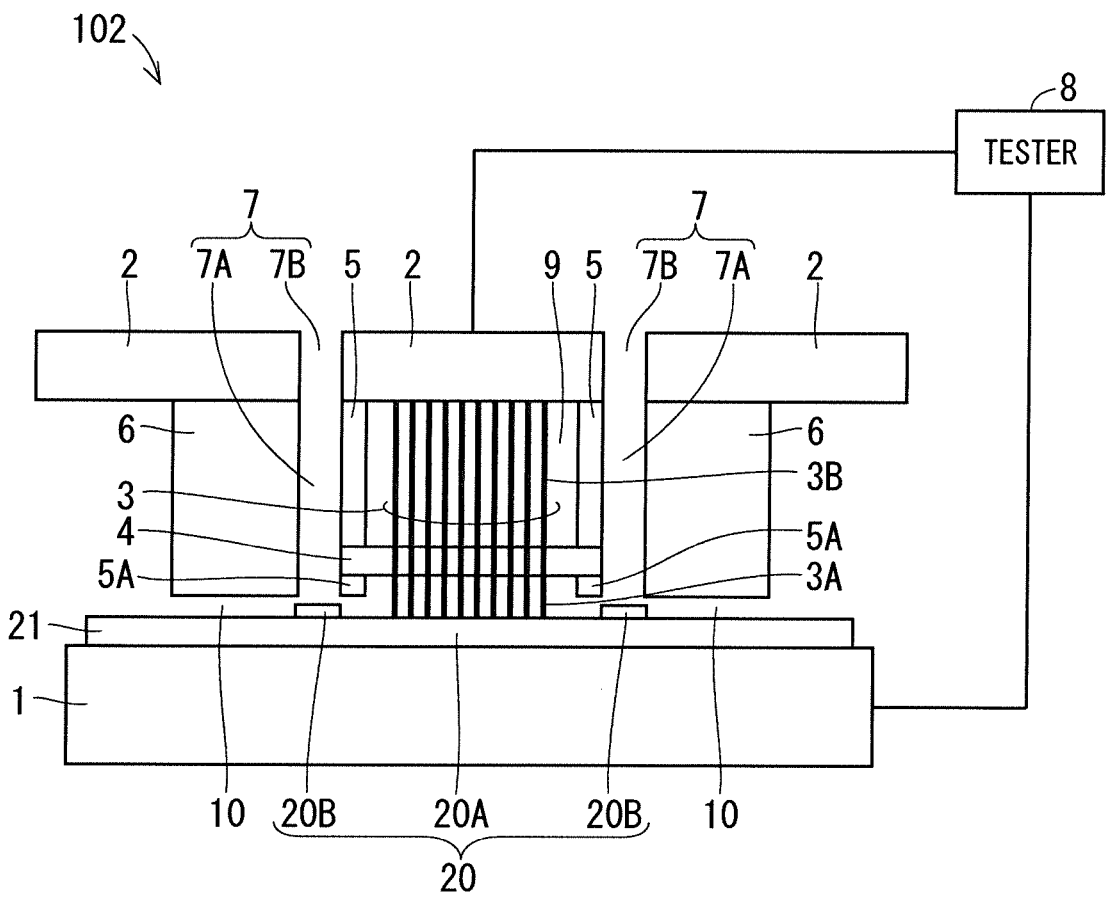

F I G. 4
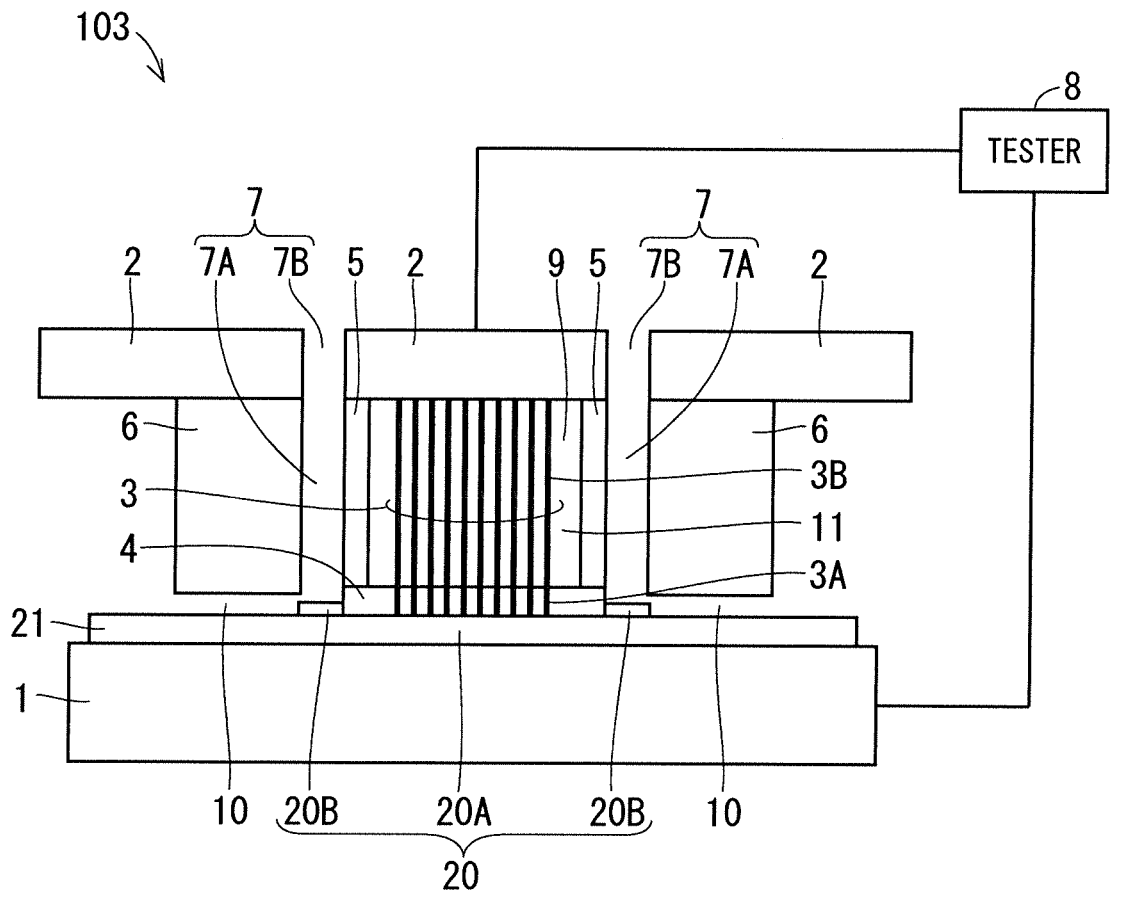

F I G. 5
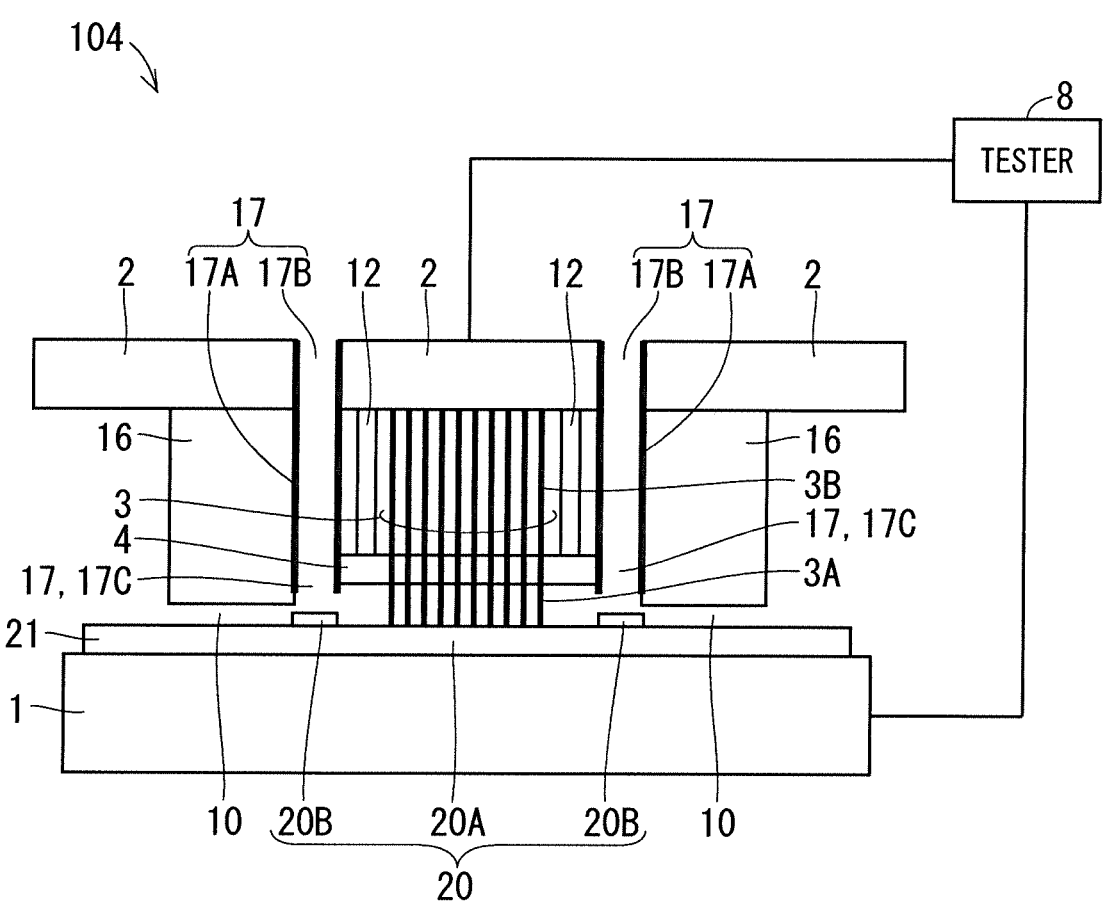

TEST APPARATUS FOR SEMICONDUCTOR DEVICE AND METHOD OF MANUFACTURING SEMICONDUCTOR DEVICE

BACKGROUND OF THE INVENTION

Field of the Invention

The present disclosure relates to a test apparatus for a semiconductor device and a method of manufacturing the semiconductor device.

Description of the Background Art

Test apparatuses for semiconductor devices inspect electrical characteristics of the semiconductor devices. In the inspection, a high voltage is applied to a semiconductor device. When the test apparatus inspects electrical characteristics of a semiconductor device that is a wafer, discharge may occur in the vicinity of the surface of the wafer. The discharge destroys the semiconductor device to be inspected, and semiconductor devices adjacent to the semiconductor device.

The prober described in Japanese Patent Application Laid-Open No. 2018-160591 includes an enclosed space disposed to surround a probe. The gas introduced to the enclosed space in the prober prevents discharge in the vicinity of the surface of a wafer.

With improvement in performance of the semiconductor devices, the inspection steps require application of high voltages and passage of large currents. To meet such requirements, increasing the number of pins of a probe and using thin wire probes have been proposed. The thin wire probes are, however, prone to deformation with the stress given from outside. The gas injected for inhibiting discharge impinges on the thin wire probes, and deforms the thin wire probes. The deformation of the probes leads to an unreliable contact between the probes and the semiconductor device to be inspected, and decreases the reliability of a test on electrical characteristics.

SUMMARY

The present disclosure provides a test apparatus for a semiconductor device which reduces deformation of probes and discharge in the vicinity of the surface of a wafer and which enhances the reliability of a test on electrical characteristics.

The test apparatus for a semiconductor device according to the present disclosure includes a stage, a probe holder, a plurality of probes, a wind protection wall, and a gas supply part. The stage is capable of holding a semiconductor wafer in which the semiconductor device is formed. The probe holder is disposed above the stage. A plurality of probes each include a tip contactable with the semiconductor device, the plurality of probes being held by the probe holder. The wind protection wall circumferentially surrounds the plurality of probes. The gas supply part is disposed outside the wind protection wall. The gas supply part supplies gas in a direction toward the stage. Each of the plurality of probes includes an inner part closer to a base end than to the tip. The inner parts are contained in a wind protection space surrounded by the wind protection wall.

Provided is a test apparatus for a semiconductor device which reduces deformation of probes and discharge in the vicinity of the surface of a wafer and which enhances the reliability of a test on electrical characteristics.

These and other objects, features, aspects, and advantages of the present invention will become more apparent from the following detailed description of the present invention when taken in conjunction with the accompanying drawings.

BRIEF DESCRIPTION OF THE DRAWINGS

FIG. 1 illustrates a structure of a test apparatus for a semiconductor device according to Embodiment 1;

FIG. 2 is a flowchart illustrating a method of manufacturing the semiconductor device according to Embodiment 1;

FIG. 3 illustrates a structure of a test apparatus for a semiconductor device according to Embodiment 2;

FIG. 4 illustrates a structure of a test apparatus for a semiconductor device according to Embodiment 3; and FIG. 5 illustrates a structure of a test apparatus for a semiconductor device according to Embodiment 4.

DESCRIPTION OF THE PREFERRED EMBODIMENTS

Embodiment 1

FIG. 1 illustrates a structure of a test apparatus 101 for a semiconductor device 20 according to Embodiment 1. The test apparatus 101 includes a stage 1, a probe holder 2, a plurality of probes 3, a contact plate 4, a wind protection wall 5, an enclosed part 6, a gas supply part 7, and a tester 8. The constituent elements other than the tester 8 are illustrated by a cross section in FIG. 1.

The test apparatus 101 tests electrical characteristics of the semiconductor device 20. The test apparatus 101 according to Embodiment 1 tests the semiconductor device 20 that is a wafer. The at least one semiconductor device 20 is formed in a semiconductor wafer 21.

The semiconductor device 20 to be tested includes an active region 20A and a terminal region 20B. The active region 20A includes a semiconductor element (not illustrated). The terminal region 20B is disposed to surround the active region 20A in a plan view. Examples of the semiconductor element formed on the active region 20A include an insulated-gate bipolar transistor (IGBT), a metal-oxide semiconductor field-effect transistor (MOSFET), and a Schottky barrier diode. Alternatively, the semiconductor element may be a reverse conducting IGBT (RC-IGBT) obtained by integrating an IGBT and a freewheeling diode on a single semiconductor chip. The semiconductor device 20 according to Embodiment 1 is a vertical semiconductor device in which a current flows between an upper surface and a lower surface of the semiconductor wafer 21. The semiconductor device 20 is, for example, a power semiconductor device. The semiconductor device 20 is made of, for example, a semiconductor such as Si. The semiconductor may be a wide-bandgap semiconductor such as SiC, GaN, $Ga_2O_3$, or diamond.

The stage 1 is capable of holding the semiconductor wafer 21. The stage 1 includes, for example, an absorption mechanism (not illustrated) for absorbing the lower surface of the semiconductor wafer 21. When being tested, the semiconductor wafer 21 is fixed to the surface of the stage 1 through the absorption mechanism. Here, the lower surface of the semiconductor wafer 21 is in contact with the surface of the stage 1. The surface of the stage 1 is electrically connected to the tester 8. In other words, the lower surface of the semiconductor device 20 to be tested is electrically connected to the tester 8 through the stage 1.

The probe holder 2 is disposed above the stage 1. The probe holder 2 is, for example, a probe card.

The probe holder 2 holds the plurality of probes 3. The probes 3 are conductive. The probes 3 are electrically connected to the tester 8 through the probe holder 2. The probes 3 come in contact with the semiconductor device 20 and input and output electrical signals in testing. Specifically, the probes 3 apply a voltage to allow a current to flow through the semiconductor device 20. Since the plurality of probes 3 are provided in the test apparatus 101, a large current can flow through the semiconductor device 20. The probes 3 according to Embodiment 1 have a thin wire structure. The probes 3 are, for example, thin wire probes such as wire probes.

Each of the probes 3 includes a tip 3A and an inner part 3B. The tip 3A is provided in contact with a predetermined position inside the active region 20A of the semiconductor device 20 in testing. The tip 3A is in contact with, for example, an electrode (not illustrated) formed on the upper surface of the semiconductor device 20 in testing. The inner part 3B is closer to a base end than to the tip 3A of the probe 3. Here, the base end is opposite to the tip, that is, is in a direction of the probe holder 2. The inner parts 3B are contained in a wind protection space 9. The wind protection space 9 is a space enclosed by at least the wind protection wall 5. The wind protection space 9 according to Embodiment 1 is a space enclosed by the probe holder 2, the contact plate 4, and the wind protection wall 5. The wind protection wall 5 isolates the wind protection space 9 from a gas path 7A of the gas supply part 7 to be described later.

The contact plate 4 is disposed between the tips 3A of the probes 3 and the probe holder 2. The contact plate 4 is disposed to overlap the active region 20A of the semiconductor device 20 in a plan view in testing. The contact plate 4 includes a plurality of through holes (not illustrated). The plurality of probes 3 pass through the respective through holes. The tips 3A of the probes 3 are exposed from the through holes. The tips 3A of the probes 3 protrude from the through holes outside the wind protection space 9, that is, toward the stage 1. The probes 3 are not fixed to the through holes. Thus, when a load is applied to the probes 3 in a vertical direction, the probes 3 freely move up and down through the through holes. The contact plate 4 is made of, for example, an insulating material such as a resin. The contact plate 4 ensures that the probes 3 come in contact with the predetermined positions inside the active region 20A of the semiconductor device 20.

The wind protection wall 5 is disposed to circumferentially surround the plurality of probes 3. The wind protection wall 5 according to Embodiment 1 is rectangular in a plan view. The wind protection wall 5 surrounds the plurality of probes 3 on all sides. The wind protection wall 5 is disposed between the probe holder 2 and the contact plate 4 in a cross-sectional view. In Embodiment 1, an upper end of the wind protection wall 5 is in contact with the probe holder 2, and the probe holder 2 holds the wind protection wall 5. A lower end of the wind protection wall 5 is in contact with the contact plate 4, and the wind protection wall 5 holds the contact plate 4. The wind protection wall 5 closes the space between the probe holder 2 and the contact plate 4.

The enclosed part 6 is disposed outside the wind protection wall 5 further to circumferentially surround the plurality of probes 3. The enclosed part 6 according to Embodiment 1 is rectangular in a plan view. The enclosed part 6 surrounds the wind protection wall 5 and the contact plate 4 on all sides. There is a clearance between the wind protection wall 5 and the enclosed part 6. The enclosed part 6 extends from the probe holder 2 toward the stage 1 in a cross-sectional view.

The gas supply part 7 is disposed outside the wind protection wall 5. The gas supply part 7 according to Embodiment 1 is disposed along the wind protection wall 5. The gas supply part 7 supplies gas in a direction toward the stage 1.

The gas supply part 7 includes the gas path 7A and a gas inlet 7B. The gas path 7A is provided between the wind protection wall 5 and the enclosed part 6, and extends in the direction toward the stage 1. The gas path 7A according to Embodiment 1 corresponds to the clearance between the wind protection wall 5 and the enclosed part 6. The gas inlet 7B is provided on an upper surface of the probe holder 2. The gas inlet 7B is located between the wind protection wall 5 and the enclosed part 6 or between the contact plate 4 and the enclosed part 6 in a plan view. In testing, the gas supply part 7 injects gas into a pressure space 10 between the enclosed part 6 and the semiconductor wafer 21 from the gas inlet 7B through the gas path 7A to apply a pressure to the pressure space 10. This reduces the possibility of discharge when a voltage is applied. The gas to be injected is, for example, dry air.

The tester 8 is electrically connected to the plurality of probes 3 through the probe holder 2. Furthermore, the tester 8 is electrically connected to the surface of the stage 1. The tester 8 applies a voltage to the semiconductor device 20 through the probes 3 and the surface of the stage 1 to test the electrical characteristics of the semiconductor device 20.

FIG. 2 is a flowchart illustrating a method of manufacturing the semiconductor device 20 according to Embodiment 1. This method of manufacturing the semiconductor device 20 is a method of testing the electrical characteristics by the test apparatus 101 and manufacturing the semiconductor device 20.

In Step S1, the semiconductor wafer 21 in which the semiconductor device 20 is formed is prepared.

In Step S2, the semiconductor wafer 21 is disposed on the stage 1. Here, the semiconductor wafer 21 is held on the surface of the stage 1 through the absorption mechanism.

In Step S3, the tip 3A of each of the probes 3 is brought in contact with the active region 20A of the semiconductor device 20 to be tested.

In Step S4, the gas supply part 7 supplies the gas in the direction toward the stage 1 while the tip 3A of each of the probes 3 is in contact with the active region 20A. Specifically, the gas supply part 7 injects the gas into the pressure space 10 to apply a pressure to the pressure space 10. The gas supply part 7 injects the gas from the gas inlet 7B into the pressure space 10 through the gas path 7A.

In Step S5, the tester 8 applies a voltage to the semiconductor device 20 through the plurality of probes 3 with the pressure being applied to the pressure space 10. In other words, the tester 8 allows a current to flow through the semiconductor device 20 to test the electrical characteristics of the semiconductor device 20. Here, the tester 8 applies, for example, a voltage of several thousand volts or more to allow a current of several hundred amperes or more to flow through the semiconductor device 20, depending on usage of the semiconductor device 20. Since the tester 8 applies the voltage with the pressure being applied to the pressure space 10, the discharge in the vicinity of the surface of the semiconductor wafer 21 is inhibited.

In Step S6, the tester 8 stops applying the voltage to the semiconductor device 20 to stop the current.

In Step S7, the gas supply part 7 stops injecting the gas into the pressure space 10. The pressure in the pressure space 10 is restored to the ordinary pressure.

In Step S8, the tip 3A of each of the probes 3 is detached from the semiconductor device 20.

Steps S1 to S8 are the method of manufacturing the semiconductor device 20. The inner parts 3B of the probes 3 are contained in the wind protection space 9 enclosed by the probe holder 2, the contact plate 4, and the wind protection wall 5. The wind protection wall 5 isolates the wind protection space 9 from the gas path 7A. The gas to be injected from the gas inlet 7B does not flow into the wind protection space 9 because the gas is blocked by the wind protection wall 5. Thus, the pressure of the gas does not deform the inner parts 3B of the probes 3. The gas is preferably injected only when application of a pressure is required and a voltage is applied to inhibit the discharge.

In summary, the test apparatus 101 for the semiconductor device 20 according to Embodiment 1 includes the stage 1, the probe holder 2, the plurality of probes 3, the wind protection wall 5, and the gas supply part 7. The stage 1 is capable of holding the semiconductor wafer 21 in which the semiconductor device 20 is formed. The probe holder 2 is disposed above the stage 1. The plurality of probes 3 each include the tip 3A contactable with the semiconductor device 20, the plurality of probes 3 being held by the probe holder 2. The wind protection wall 5 circumferentially surrounds the plurality of probes 3. The gas supply part 7 is disposed outside the wind protection wall 5. The gas supply part 7 injects gas in a direction toward the stage 1. Each of the plurality of probes 3 includes the inner part 3B closer to a base end than to the tip 3A. The inner parts 3B are contained in a wind protection space 9 surrounded by the wind protection wall 5.

In this test apparatus 101, the wind protection space 9 contains portions of the probes 3 other than the tips 3A. The gas to be injected by the gas supply part 7 does not directly impinge on the inner parts 3B of the probes 3 because the gas is blocked by the wind protection wall 5. This inhibits or prevents deformation of the probes 3 caused by the injection of the gas.

When thin wire probes such as wire probes are applied as the probes 3, particularly, the following advantages are produced. The thin wire probes are prone to deformation with the stress given from outside. Since the inner parts 3B of the thin wire probes are contained in the wind protection space 9, the deformation of the thin wire probes is inhibited. This enables application of the thin wire probes. Thus, a large current can be measured, and damage to the semiconductor device 20 caused by contact with the probes 3 is reduced.

When a voltage is applied to the semiconductor device 20, a pressure is applied to the pressure space 10 between the enclosed part 6 and the semiconductor wafer 21. This reduces the discharge in the vicinity of the surface of the semiconductor wafer 21.

The tips 3A of the probes 3 protrude outside the wind protection space 9. The probes 3 are not fixed to the contact plate 4. Thus, the probes 3 can freely move up and down. Thereby, the tips 3A of the probes 3 are reliably in contact with the semiconductor device 20.

Consequently, the test apparatus 101 reduces deformation of the probes 3 and discharge in the vicinity of the surface of the semiconductor wafer 21, and enhances the reliability of the test on the electrical characteristics.

The semiconductor device 20 to be tested may be a wafer or a chip. The semiconductor device 20 that is a wafer corresponds to one of a plurality of semiconductor devices which are formed in the semiconductor wafer 21 and are to be singulated. The semiconductor device 20 that is a chip corresponds to one of the semiconductor devices singulated from the semiconductor wafer 21.

Embodiment 2

In Embodiment 2, the same references will be assigned to the constituent elements identical to those in Embodiment 1, and the detailed description thereof will be omitted.

FIG. 3 illustrates a structure of a test apparatus 102 for the semiconductor device 20 according to Embodiment 2. The constituent elements other than the tester 8 are illustrated by a cross section in FIG. 3.

The wind protection wall 5 is disposed between the probe holder 2 and the contact plate 4 in a cross-sectional view, similarly to Embodiment 1. The wind protection wall 5 closes the space between the probe holder 2 and the contact plate 4. In Embodiment 2, a lower end 5A of the wind protection wall 5 is located below the contact plate 4. In other words, the wind protection wall 5 includes an extension protruding below the contact plate 4. The lower end 5A of the wind protection wall 5 is located above the tip 3A of each of the probes 3.

The method of manufacturing the semiconductor device 20 according to Embodiment 2 is identical to that according to Embodiment 1. In Steps S3 to S7, the tip 3A of each of the probes 3 is in contact with the semiconductor device 20 to be tested. However, the lower end 5A of the wind protection wall 5 is not in contact with the semiconductor wafer 21.

In this structure, the wind protection wall 5 encloses not only the inner parts 3B of the probes 3 but also at least a part of the tips 3A. The gas to be injected by the gas supply part 7 hardly directly impinges on the tips 3A of the probes 3. The test apparatus 102 inhibits or prevents deformation of the tips 3A of the probes 3 caused by the gas injected into the pressure space 10.

Embodiment 3

In Embodiment 3, the same references will be assigned to the constituent elements identical to those in Embodiment 1 or 2, and the detailed description thereof will be omitted.

FIG. 4 illustrates a structure of a test apparatus 103 for the semiconductor device 20 according to Embodiment 3. The constituent elements other than the tester 8 are illustrated by a cross section in FIG. 4.

The test apparatus 103 includes a filler 11. The filler 11 is encapsulated in the wind protection space 9 enclosed by the probe holder 2, the contact plate 4, and the wind protection wall 5. The filler 11 is made of an insulating and elastic material. The filler 11 is, for example, a sponge or rubber. Each of the probes 3 is covered with the filler 11. In other words, each of the probes 3 is contained in the filler 11. The filler 11 may be integrated with the wind protection wall 5 and the contact plate 4. In other words, the wind protection wall 5 and the contact plate 4 which form the wind protection space 9 may be one part made of the same material as that of the filler 11.

The method of manufacturing the semiconductor device 20 according to Embodiment 3 is identical to that according to Embodiment 1. In Steps S3 to S7, the tip 3A of each of the probes 3 is in contact with the semiconductor device 20 to be tested. For example, a lower end of the contact plate 4 that is made of the same material as that of the filler 11 and is elastic (i.e., a lower end of the filler 11 integrated with the contact plate 4) is also in contact with the active region 20A of the semiconductor device 20. The lower end of the contact plate 4 (i.e., the lower end of the filler 11 integrated with the contact plate 4) is not in contact with the terminal region 20B of the semiconductor device 20.

In such a structure, the probes 3 are contained in the filler 11. The gas to be injected by the gas supply part 7 does not impinge on the probes 3. The test apparatus 103 effectively inhibits or prevents the deformation of the probes 3 caused by the gas injected into the pressure space 10.

Embodiment 4

In Embodiment 4, the same references will be assigned to the constituent elements identical to those in any one of Embodiments 1 to 3, and the detailed description thereof will be omitted.

FIG. 5 illustrates a structure of a test apparatus 104 for the semiconductor device 20 according to Embodiment 4. The test apparatus 104 includes the stage 1, the probe holder 2, the plurality of probes 3, the contact plate 4, struts 12, an enclosed part 16, a gas supply part 17, and the tester 8. The constituent elements other than the tester 8 are illustrated by a cross section in FIG. 5. The structure of the stage 1, the probe holder 2, the plurality of probes 3, the contact plate 4, and the tester 8 is identical to that according to Embodiment 1.

The test apparatus 104 does not include the wind protection wall 5 but includes the struts 12. The struts 12 are disposed between the probe holder 2 and the contact plate 4. Upper ends of the struts 12 are in contact with the probe holder 2, and lower ends of the struts 12 are in contact with the contact plate 4. The probe holder 2 holds the contact plate 4 through the struts 12.

The enclosed part 16 circumferentially surrounds the contact plate 4 and the plurality of probes 3. The enclosed part 16 according to Embodiment 4 is rectangular in a plan view. The enclosed part 16 surrounds the contact plate 4 and the plurality of probes 3 on all sides.

The gas supply part 17 includes a gas pipe 17A, a gas inlet 17B, and a gas port 17C. The gas pipe 17A extends from the probe holder 2 toward the stage 1. The gas pipe 17A is disposed between the plurality of probes 3 and the enclosed part 16 and between the contact plate 4 and the enclosed part 16. The gas supply part 17 supplies gas in the direction toward the stage 1 through the gas pipe 17A.

The gas inlet 17B is connected to the gas pipe 17A. The gas inlet 17B is provided on an upper surface of the probe holder 2. The gas inlet 17B is located between the contact plate 4 and the enclosed part 16 in a plan view.

The gas port 17C is connected to the gas pipe 17A. The gas port 17C is provided at an end of the gas pipe 17A which is closer to the stage 1. Preferably, the height of the gas port 17C from the stage 1 is identical to that of the contact plate 4 from the stage 1.

The method of manufacturing the semiconductor device 20 according to Embodiment 4 is identical to that according to Embodiment 1. In Steps S3 to S7, the tip 3A of each of the probes 3 is in contact with the semiconductor device 20 to be tested. However, the gas port 17C is not in contact with the semiconductor wafer 21.

In Step S4, the gas supply part 17 injects the gas into the pressure space 10 to apply a pressure to the pressure space 10. The gas supply part 17 supplies the gas from the gas inlet 17B to the gas pipe 17A, and injects the gas from the gas port 17C into the pressure space 10.

In Step S5, the tester 8 applies a voltage to the semiconductor device 20 through the plurality of probes 3 with the pressure being applied to the pressure space 10. Since the tester 8 applies the voltage with the pressure being applied to the pressure space 10, discharge in the vicinity of the surface of the semiconductor wafer 21 is inhibited.

In the test apparatus 104, the gas to be injected by the gas supply part 17 does not directly impinge on the probes 3. Thus, the probes 3 are not deformed due to the injection of the gas. When the voltage is applied to the semiconductor device 20, the pressure is applied to the pressure space 10 between the enclosed part 16 and the semiconductor wafer 21. This reduces discharge in the vicinity of the surface of the semiconductor wafer 21. Consequently, the test apparatus 104 according to Embodiment 4 reduces the deformation of the probes 3 and the discharge in the vicinity of the surface of the semiconductor wafer 21, and enhances the reliability of the test on the electrical characteristics.

Embodiments of the present disclosure can be freely combined, and appropriately modified or omitted.

A summary of various aspects of the present disclosure will be hereinafter described as Appendixes.

[Appendix 1] A test apparatus for a semiconductor device, the test apparatus comprising:

a stage capable of holding a semiconductor wafer in which the semiconductor device is formed;

a probe holder above the stage;

a plurality of probes each including a tip contactable with the semiconductor device, the plurality of probes being held by the probe holder;

a wind protection wall circumferentially surrounding the plurality of probes; and a gas supply part outside the wind protection wall, the gas supply part supplying gas in a direction toward the stage, each of the plurality of probes including an inner part closer to a base end than to the tip, wherein the inner parts are contained in a wind protection space surrounded by the wind protection wall.

[Appendix 2] The test apparatus according to appendix 1, further comprising a plate including a plurality of through holes through which the plurality of probes pass so that the respective tips protrude from the plurality of through holes, wherein the wind protection space is surrounded by the probe holder, the plate, and the wind protection wall.

[Appendix 3] The test apparatus according to appendix 1 or 2, further comprising an enclosed part outside the wind protection wall, the enclosed part further surrounding the plurality of probes, wherein the gas supply part includes:

a gas inlet on the probe holder, the gas inlet being located between the wind protection wall and the enclosed part in a plan view; and a gas path between the wind protection wall and the enclosed part, the gas path extending in the direction toward the stage.

[Appendix 4] The test apparatus according to any one of appendixes 1 to 3, wherein the plurality of probes are a plurality of thin wire probes.

[Appendix 5] The test apparatus according to any one of appendixes 1 to 4, further comprising a tester electrically connected to the plurality of probes through the probe holder, the tester applying a voltage to the semiconductor device through the plurality of probes and testing electrical characteristics of the semiconductor device.

[Appendix 6] The test apparatus according to appendix 2, wherein a lower end of the wind protection wall is located below the plate, and is located above the tips of the plurality of probes.

[Appendix 7] The test apparatus according to any one of appendixes 1 to 6, further comprising a filler encapsulated in the wind protection space, wherein the filler is a sponge or rubber.

[Appendix 8] A test apparatus for a semiconductor device, the test apparatus comprising:

a stage capable of holding a semiconductor wafer in which the semiconductor device is formed;

a probe holder above the stage;

a plurality of probes each including a tip contactable with the semiconductor device, the plurality of probes being held by the probe holder;

a plate including a plurality of through holes through which the plurality of probes pass so that the respective tips protrude from the plurality of through holes;

an enclosed part circumferentially surrounding the plate and the plurality of probes; and a gas supply part including a gas pipe between the plate and the enclosed part, the gas supply part supplying gas in a direction toward the stage through the gas pipe.

[Appendix 9] The test apparatus according to appendix 8, wherein the gas supply part includes a gas inlet and a gas port that are connected to the gas pipe, the gas pipe extends from the probe holder toward the stage, the gas inlet is provided on the probe holder, and is located between the plate and the enclosed part in a plan view, and a height of the gas port from the stage is identical to a height of the plate from the stage.

[Appendix 10] The test apparatus according to appendix 8 or 9, wherein the plurality of probes are a plurality of thin wire probes.

[Appendix 11] The test apparatus according to any one of appendixes 8 to 10, further comprising a tester electrically connected to the plurality of probes through the probe holder, the tester applying a voltage to the semiconductor device through the plurality of probes and testing electrical characteristics of the semiconductor device.

[Appendix 12] A method of manufacturing a semiconductor device, the method comprising:

holding, on a stage, a semiconductor wafer in which the semiconductor device is formed;

bringing, in contact with the semiconductor device, a tip of each of a plurality of probes held by a probe holder located above the stage; and supplying gas in a direction toward the stage from a gas supply part outside a wind protection wall circumferentially surrounding the plurality of probes, wherein each of the plurality of probes includes an inner part closer to a base end than to the tip, and the inner parts are contained in a wind protection space surrounded by the wind protection wall.

[Appendix 13] The method according to appendix 12, the method further comprising disposing a plate including a plurality of through holes through which the plurality of probes pass so that the respective tips protrude from the plurality of through holes, wherein the wind protection space is surrounded by the probe holder, the plate, and the wind protection wall.

[Appendix 14] The method according to appendix 12 or 13, wherein the supplying includes injecting the gas into a pressure space between an enclosed part and the semiconductor wafer to apply a pressure to the pressure space, the enclosed part being disposed outside the wind protection wall further to circumferentially surround the plurality of probes, the gas is injected from a gas inlet into the pressure space through a gas path, the gas inlet is provided on the probe holder, and is located between the wind protection wall and the enclosed part in a plan view, and the gas path is provided between the wind protection wall and the enclosed part, the gas path extending in the direction toward the stage.

[Appendix 15] The method according to any one of appendixes 12 to 14, wherein the plurality of probes are a plurality of thin wire probes.

[Appendix 16] The method according to any one of appendixes 12 to 15, further comprising applying a voltage from a tester to the semiconductor device through the plurality of probes and testing electrical characteristics of the semiconductor device, the tester being electrically connected to the plurality of probes through the probe holder.

[Appendix 17] The method according to appendix 16, further comprising stopping applying the voltage to the semiconductor device;

stopping supplying the gas; and detaching the tip of each of the plurality of probes from the semiconductor device.

While the invention has been shown and described in detail, the foregoing description is in all aspects illustrative and not restrictive. It is therefore understood that numerous modifications and variations can be devised without departing from the scope of the invention.

What is claimed is:

1. A test apparatus for a semiconductor device, the test apparatus comprising:

a stage capable of holding a semiconductor wafer in which the semiconductor device is formed;

a probe holder above the stage;

a plurality of probes each including a tip contactable with the semiconductor device, the plurality of probes being held by the probe holder;

a wind protection wall circumferentially surrounding the plurality of probes; and a gas supply part outside the wind protection wall, the gas supply part including a gas path provided in a direction toward the stage and supplying gas through the gas path, each of the plurality of probes including an inner part closer to a base end than to the tip, wherein the inner parts are contained in a wind protection space surrounded by the wind protection wall, and the wind protection wall isolates the wind protection space from the gas path.

2. The test apparatus according to claim 1, further comprising a plate including a plurality of through holes through which the plurality of probes pass so that the respective tips protrude from the plurality of through holes, wherein the wind protection space is surrounded by the probe holder, the plate, and the wind protection wall.

3. The test apparatus according to claim 1, further comprising an enclosed part outside the wind protection wall, the enclosed part further surrounding the plurality of probes, wherein the gas supply part includes:

a gas inlet on the probe holder, the gas inlet being located between the wind protection wall and the enclosed part in a plan view; and a gas path between the wind protection wall and the enclosed part, the gas path extending in the direction toward the stage.

4. The test apparatus according to claim 1, wherein the plurality of probes are a plurality of thin wire probes.

5. The test apparatus according to claim 1, further comprising a tester electrically connected to the plurality of probes through the probe holder, the tester applying a voltage to the semiconductor device through the plurality of probes and testing electrical characteristics of the semiconductor device.

6. The test apparatus according to claim 2, wherein a lower end of the wind protection wall is located below the plate, and is located above the tips of the plurality of probes.

7. The test apparatus according to claim 1, further comprising a filler encapsulated in the wind protection space, wherein the filler is a sponge or rubber.

8. A test apparatus for a semiconductor device, the test apparatus comprising:

a stage capable of holding a semiconductor wafer in which the semiconductor device is formed;

a probe holder above the stage;

a plurality of probes each including a tip contactable with the semiconductor device, the plurality of probes being held by the probe holder;

a plate including a plurality of through holes through which the plurality of probes pass so that the respective tips protrude from the plurality of through holes;

an enclosed part circumferentially surrounding the plate and the plurality of probes; and a gas supply part including a gas pipe between the plate and the enclosed part, the gas supply part supplying gas in a direction toward the stage through the gas pipe, and the gas pipe being provided outside of the plate and the enclosed part.

9. The test apparatus according to claim 8, wherein the gas supply part includes a gas inlet and a gas port that are connected to the gas pipe, the gas pipe extends from the probe holder toward the stage, the gas inlet is provided on the probe holder, and is located between the plate and the enclosed part in a plan view, and a height of the gas port from the stage is identical to a height of the plate from the stage.

10. The test apparatus according to claim 8, wherein the plurality of probes are a plurality of thin wire probes.

11. The test apparatus according to claim 8, further comprising a tester electrically connected to the plurality of probes through the probe holder, the tester applying a voltage to the semiconductor device through the plurality of probes and testing electrical characteristics of the semiconductor device.

12. A method of manufacturing a semiconductor device, the method comprising:

holding, on a stage, a semiconductor wafer in which the semiconductor device is formed;

bringing, in contact with the semiconductor device, a tip of each of a plurality of probes held by a probe holder located above the stage; and supplying gas through a gas path, the gas path being provided in a direction toward the stage outside a wind protection wall circumferentially surrounding the plurality of probes, wherein each of the plurality of probes includes an inner part closer to a base end than to the tip, the inner parts are contained in a wind protection space surrounded by the wind protection wall, and the wind protection wall isolates the wind protection space from the gas path.

13. The method of manufacturing the semiconductor device according to claim 12, the method further comprising disposing a plate including a plurality of through holes through which the plurality of probes pass so that the respective tips protrude from the plurality of through holes, wherein the wind protection space is surrounded by the probe holder, the plate, and the wind protection wall.

14. The method of manufacturing the semiconductor device according to claim 12, wherein the supplying includes injecting the gas into a pressure space between an enclosed part and the semiconductor wafer to apply a pressure to the pressure space, the enclosed part being disposed outside the wind protection wall further to circumferentially surround the plurality of probes, the gas is injected from a gas inlet into the pressure space through a gas path, the gas inlet is provided on the probe holder, and is located between the wind protection wall and the enclosed part in a plan view, and the gas path is provided between the wind protection wall and the enclosed part, the gas path extending in the direction toward the stage.

15. The method of manufacturing the semiconductor device according to claim 12, wherein the plurality of probes are a plurality of thin wire probes.

16. The method of manufacturing the semiconductor device according to claim 12, further comprising applying a voltage from a tester to the semiconductor device through the plurality of probes and testing electrical characteristics of the semiconductor device, the tester being electrically connected to the plurality of probes through the probe holder.

17. The method of manufacturing the semiconductor device according to claim 16, further comprising stopping applying the voltage to the semiconductor device;

stopping supplying the gas; and detaching the tip of each of the plurality of probes from the semiconductor device.

* * * * *